US005604432A

United States Patent [19]

[11] Patent Number: 5,604,432
[45] **Date of Patent: *Feb. 18, 1997**

Moore et al.

[54] TEST ACCESS ARCHITECTURE FOR TESTING OF CIRCUITS MODULES AT AN INTERMEDIATE NODE WITHIN AN INTEGRATED CIRCUIT CHIP

[75] Inventors: Alan Moore, Phoenix; Patrick A. Themins, Chandler, both of Ariz.

[73] Assignee: Intel Corporation, Santa Clara, Calif.

[ * ] Notice: The term of this patent shall not extend beyond the expiration date of Pat. No. 5,534,774.

[21] Appl. No.: 147,859

[22] Filed: Nov. 5, 1993

Related U.S. Application Data

[62] Division of Ser. No. 873,365, Apr. 23, 1992, Pat. No. 5,534,774.

[51] Int. Cl.[6] .................................................... G01R 31/28

[52] U.S. Cl. ....................................... 324/158.1; 324/73.1

[58] Field of Search ................................ 324/158.1, 73.1, 324/763; 371/22.6, 15.1, 27, 22.3, 22.1, 25.1; 437/8; 364/181, 551.01

[56] References Cited

U.S. PATENT DOCUMENTS 4,241,307 12/1980 Hong ...................................... 324/538
4,504,784 3/1985 Goel et al. ............................ 371/15.1
5,070,296 12/1991 Priebe .................................. 324/73.1
5,124,636 6/1992 Pincus et al. ........................ 324/158.1
5,321,277 6/1994 Sparks et al. .......................... 371/22.3
5,379,308 1/1995 Nhuyen et al. ........................ 371/22.6
5,434,804 7/1995 Bock et al. ............................ 364/579

OTHER PUBLICATIONS

Barnes; "Interconnection Test Arrangement"; IBM Technical Disclosure Bulletin; vol. 22, No. 8B; Jan. 1980.

*Primary Examiner*—Vinh P. Nguyen
*Attorney, Agent, or Firm*—Blakely, Sokoloff, Taylor & Zafman

[57] ABSTRACT

A test access architecture is implemented which allows embedded testing of reusable modules and their interconnections with each other and with primary system inputs and outputs, utilizing reusable test vectors regardless of the configuration of the integrated circuit. Also provided is a method and apparatus for controlling and observing signals within the logic of a module, using the same test access architecture.

8 Claims, 7 Drawing Sheets

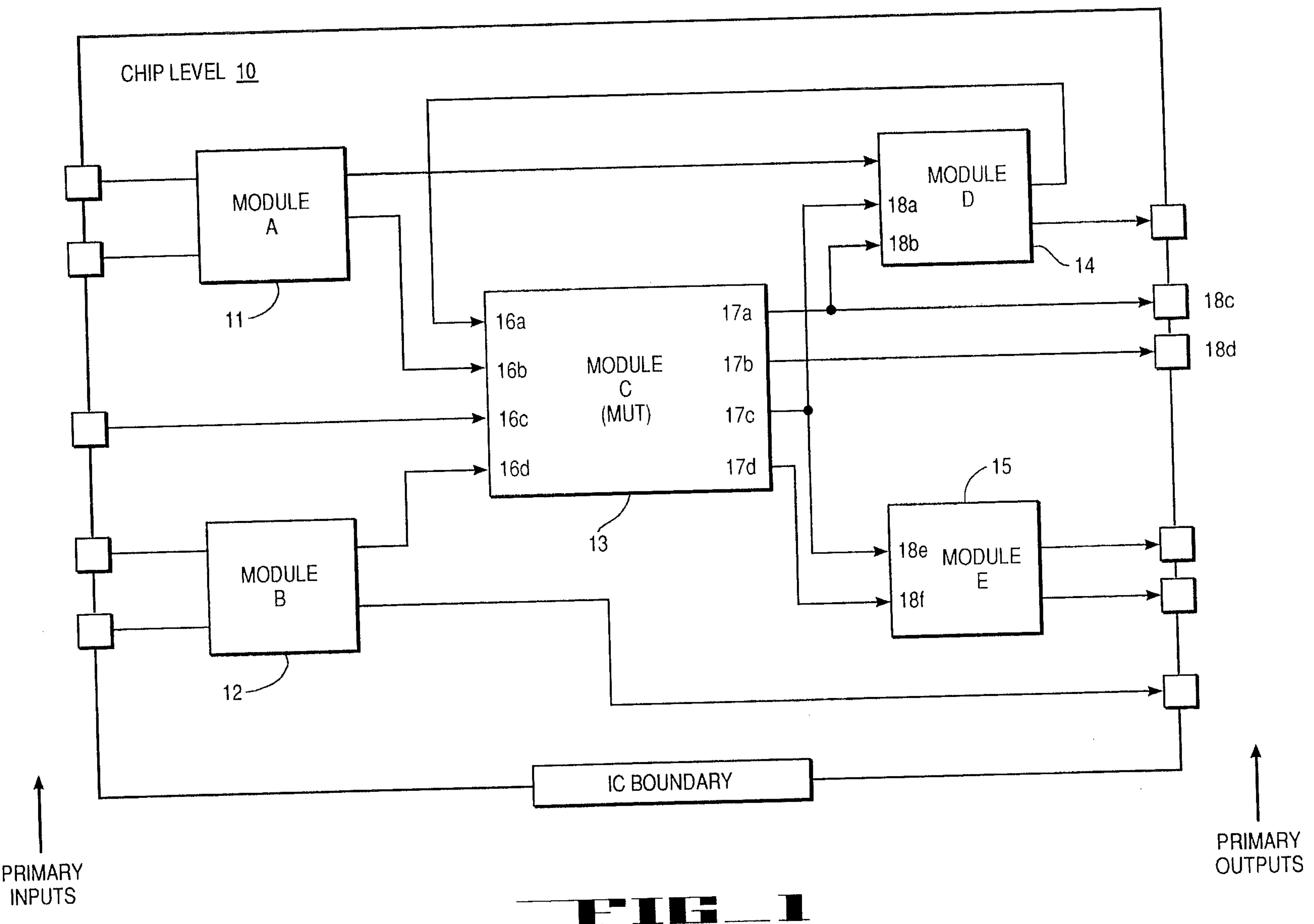
FIG_1

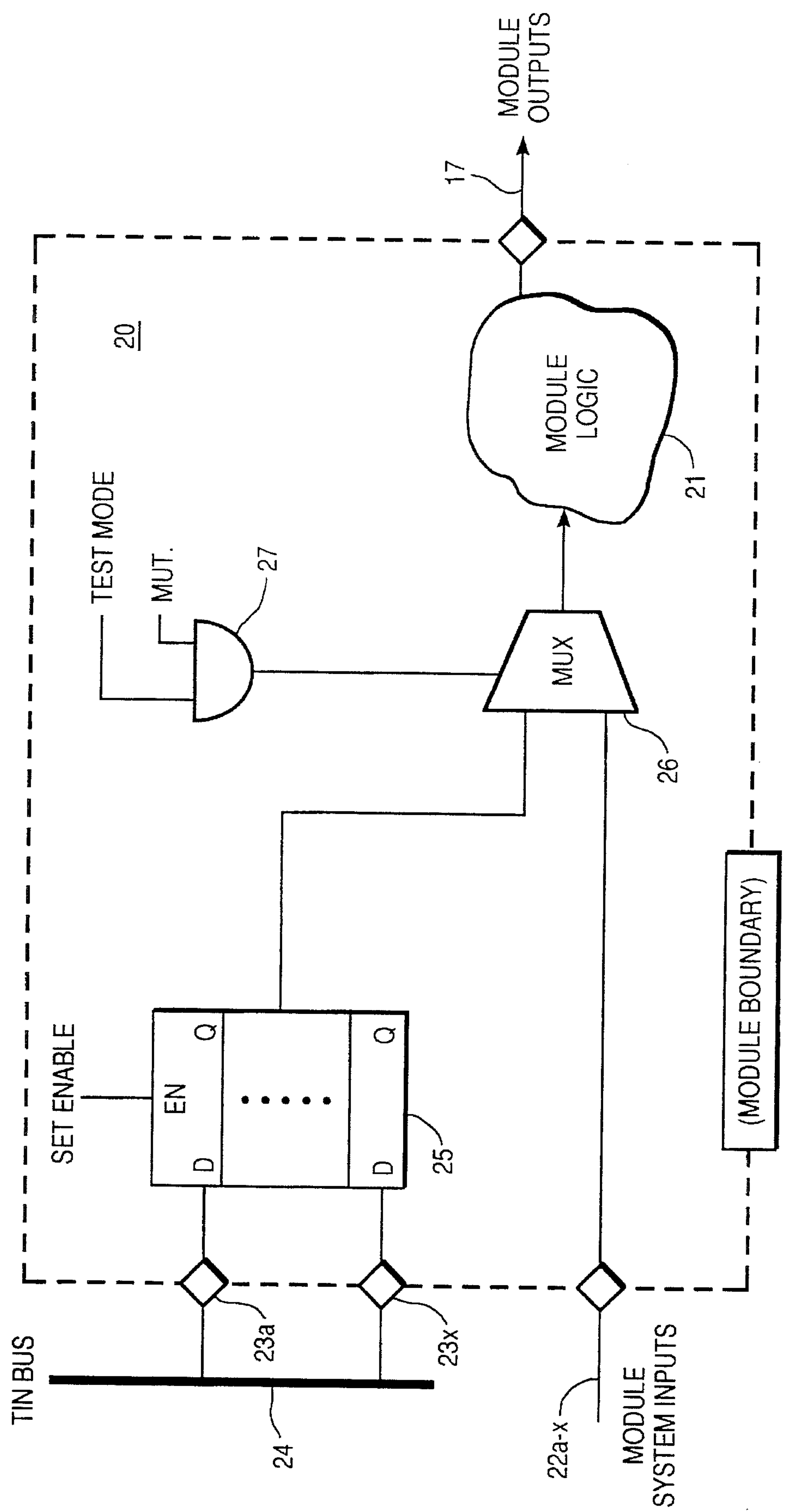
FIG_2

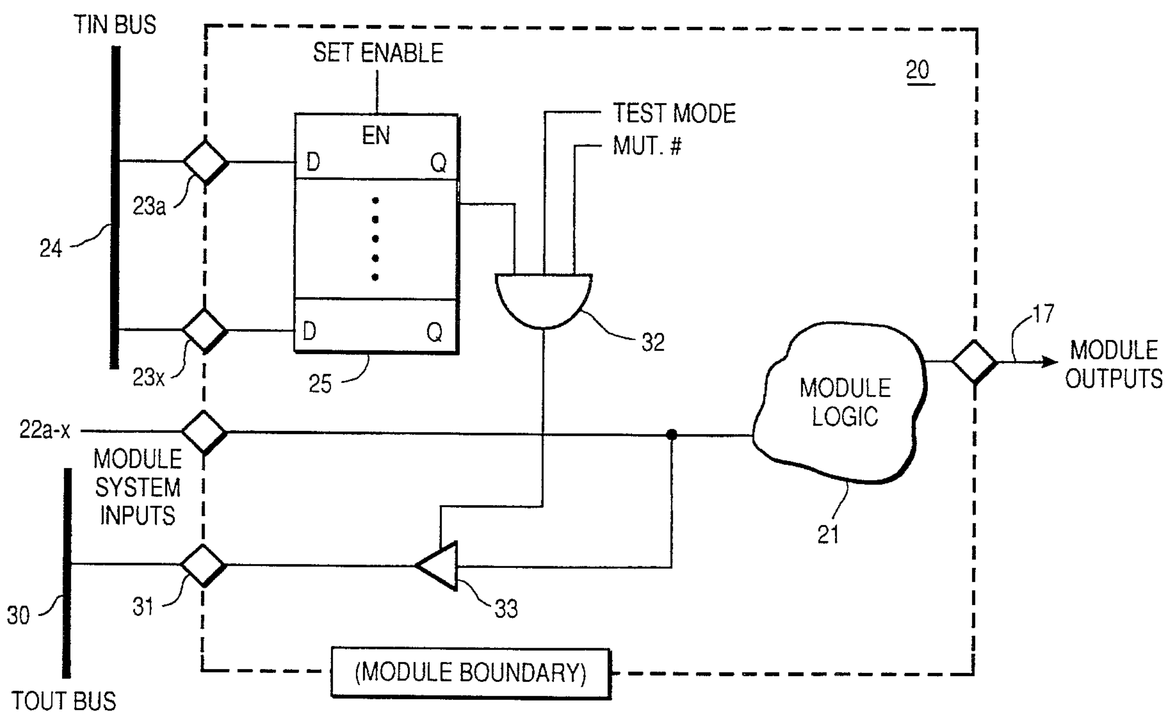
FIG_3
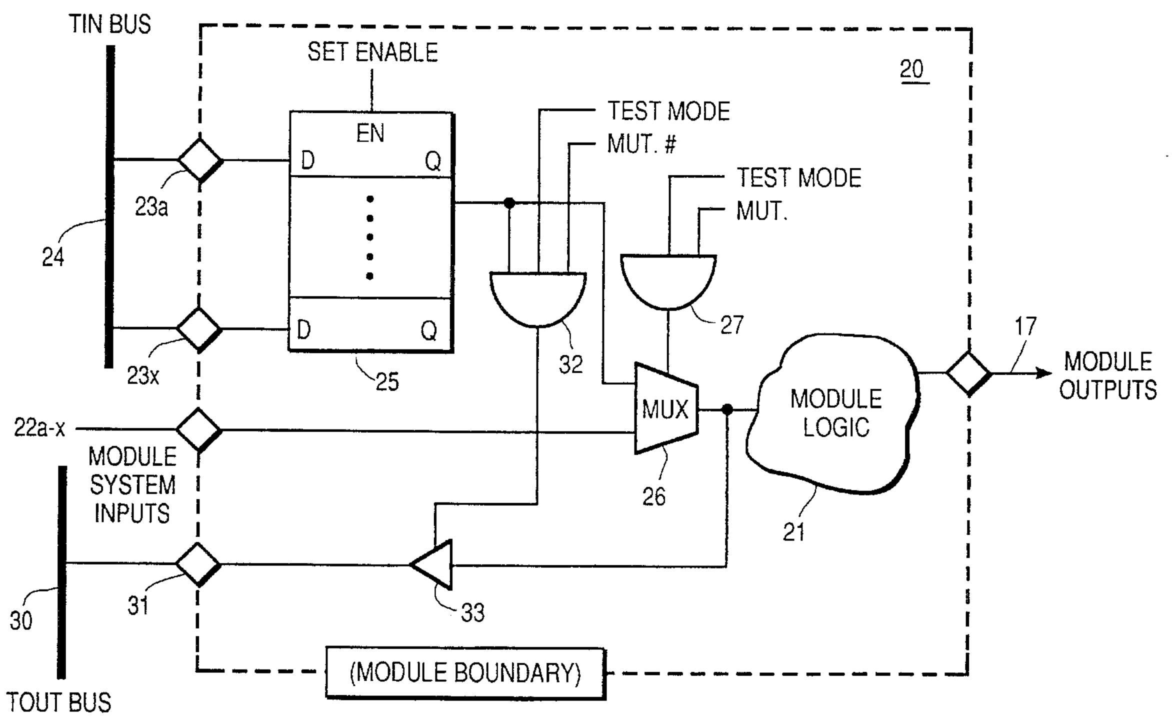
FIG_4

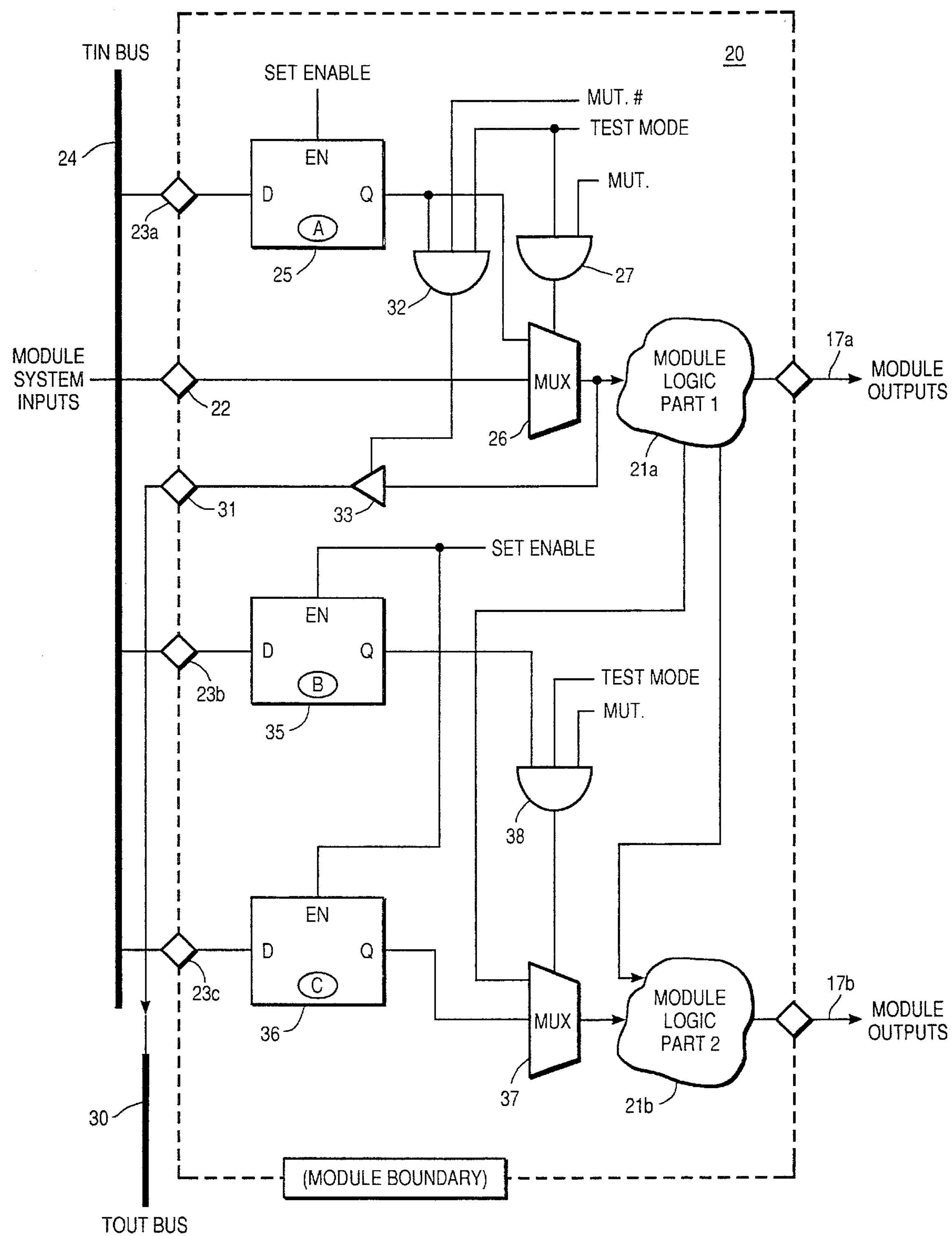
FIG_5

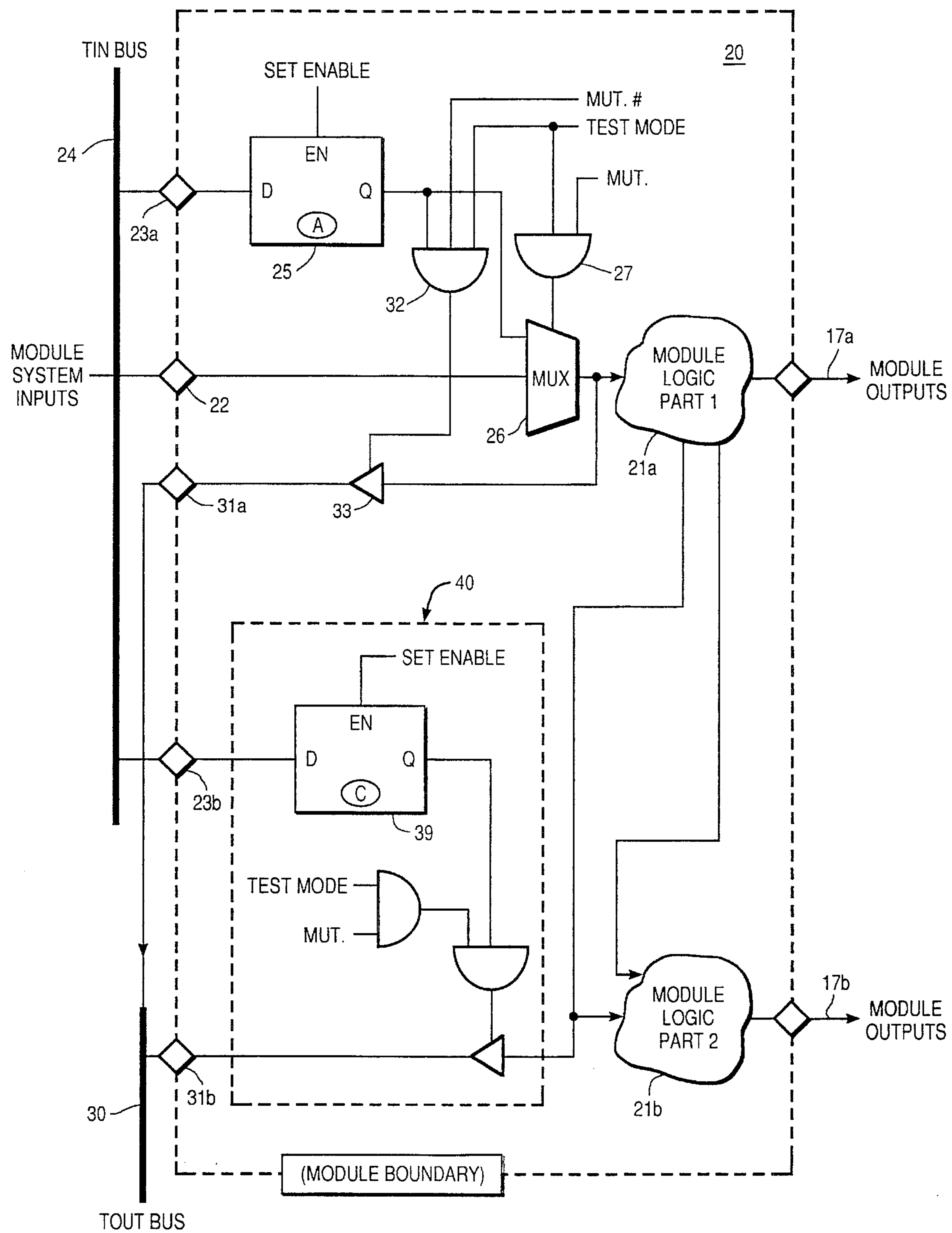
FIG_6

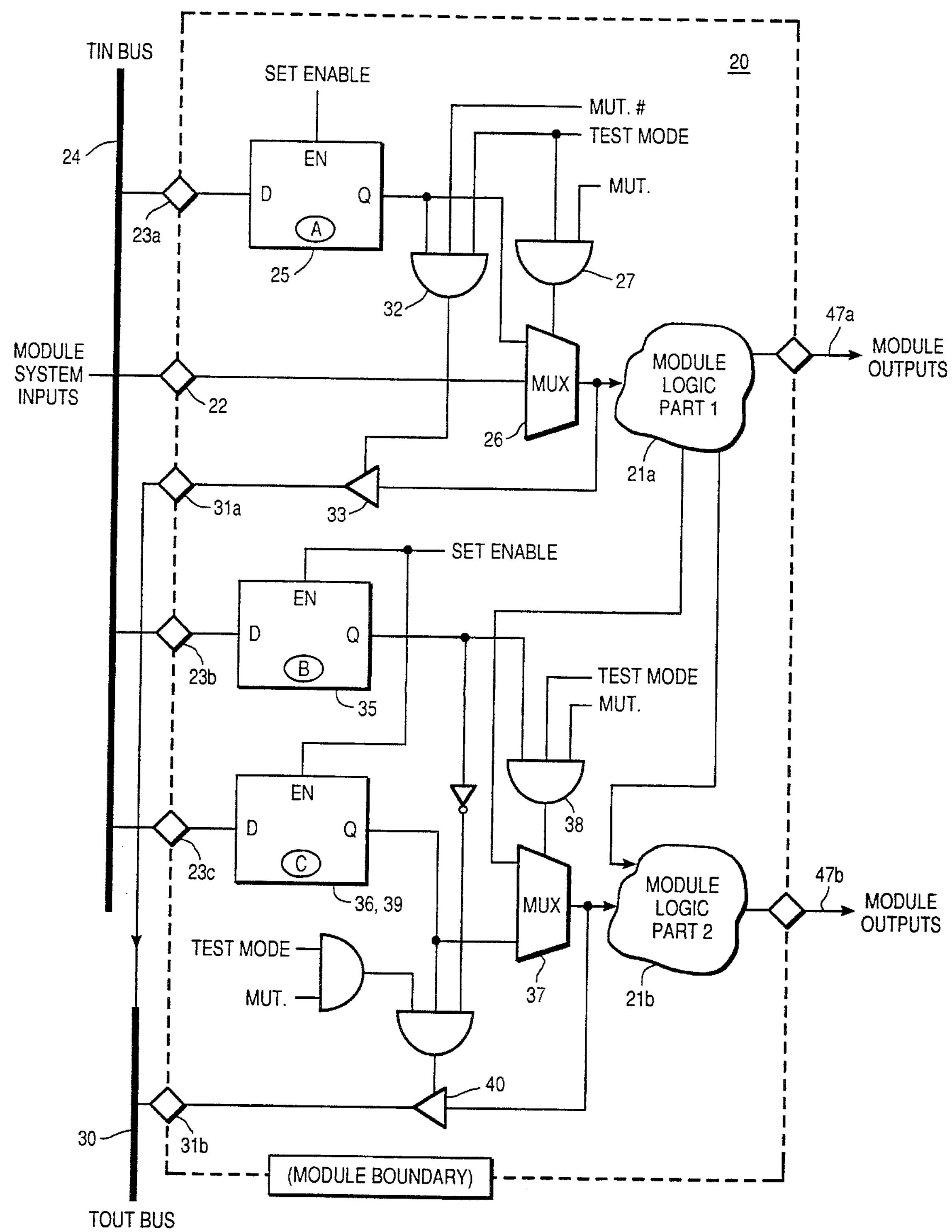
FIG_7

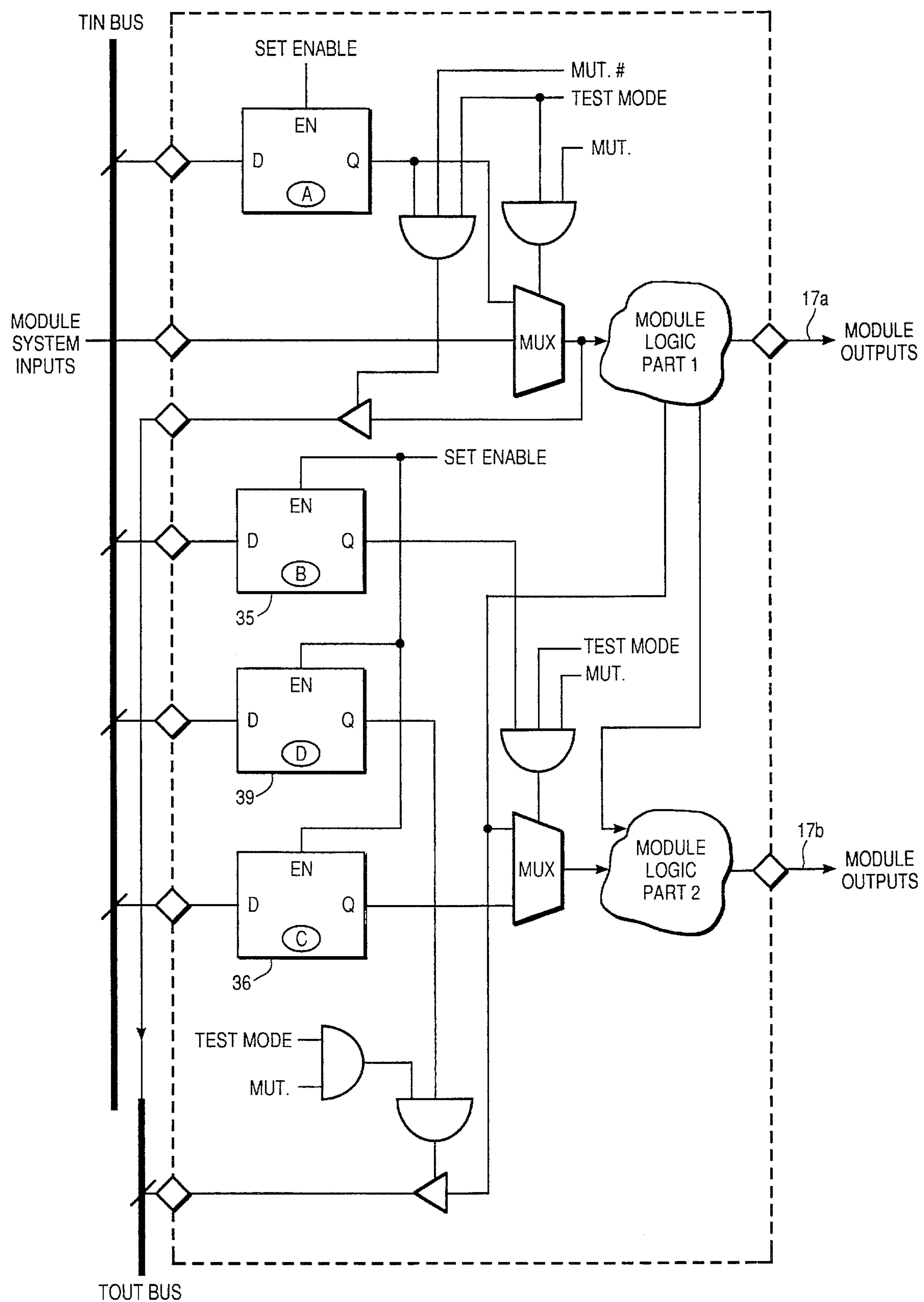
FIG_8

TEST ACCESS ARCHITECTURE FOR TESTING OF CIRCUITS MODULES AT AN INTERMEDIATE NODE WITHIN AN INTEGRATED CIRCUIT CHIP

This is a divisional of application Ser. No. 07/873,365, filed Apr. 23, 1992, now U.S. Pat. No. 5,534,774.

BACKGROUND OF THE INVENTION

1. Field of Invention

The present invention relates to an apparatus for efficient testing of embedded modules within electronic systems. More particularly, the present invention provides an access scheme for efficient testing of reusable modules within integrated circuits using reusable module test vectors regardless of the configuration of the modules within the integrated circuit.

2. Description of the Prior Art

Integrated circuits find application today in many areas far afield of their original domain in the computer industry. They can be found in devices from dishwashers and microwave ovens to planes, medical equipment and communications devices. Because proper functioning of embedded integrated circuits is often critical to the device in which they operate, it is essential that comprehensive testing be performed when they are being mass produced to ensure that the end product performs as designed, and is as fault and error free as possible. Thus, because every chip must be tested during production, test overhead becomes a serious concern for semiconductor manufacturers.

As chip designs become more complex, the physical overhead and time required for testing can contribute significantly to the overall cost of the devices. For simple chip designs it is a simple matter to test the chip as a whole. A set of test inputs and expected responses, the test vectors, are developed, and if the chip is in good condition, its response to the test inputs will match the expected responses predicted. However, as integrated circuits become more complex, the development of new test vectors becomes very difficult and expensive to implement for every chip design. Further, testing chips as a whole makes it difficult to isolate problems that may be occurring in specific functional areas of the chip.

Today, integrated circuit design has taken on a modular approach in which there are certain modules that will be common within many integrated circuits, though they may be configured differently. For example, common modules include timers, counters, digital-to-analog converter, central processing units (CPU), direct memory access controllers (DMA), etc. Application Specific Integrated Circuits (ASIC) may also be built around different configurations of the same pre-existing modules. However, the configuration of the modules within a given chip will determine what test vectors are required to implement a chip-as-a-whole testing scheme. Thus, even though two chips may contain exactly the same modular elements, their unique configurations may require the development of completely different test schemes and test vectors. This is so because many of the modules will be embedded within the chip such that there is no direct access to them. Their inputs will be signals which have propagated through other modules prior to reaching them while their outputs may need to propagate through other modules before they are accessible outside the chip. For example, in one configuration, to test a timer might require developing test vectors that will have to pass through a CPU on their way to the timer and then have to be propagated through a counter on their way out of the chip. In addition to the arduous task of simulating the chip to determine the required inputs to get desired outputs, a bad response won't guarantee that the problem is within the timer. The problem may be occurring within the CPU or the counter or at any of the interconnects between any of those modules.

Obviously the problem is exacerbated when the number of modules within the integrated circuit increases and the level of module embeddedness increases. If it were possible to access each module directly then a standard set of test vectors for that type of module could be implemented. That is, every use of a module of a particular type would receive exactly the same test vectors as inputs, and exactly the same results would be expected. The problem is that rarely is every module directly accessible for all inputs and outputs. It would require a large silicon and package pin overhead to design complex integrated circuits such that all modules would be directly accessible to system pins in that manner. Thus, there is a need for a design scheme which provides for accessing modules to deliver standard test vectors and a way to access those modules' outputs, but without the overhead of trying to design integrated circuits with direct pin access to every module's complete input and output set.

One approach to the problem of embedded module testing is to use a bus to convey input test vectors to a desired module and another bus to convey the module's output signals out of the chip. These busses may have their own pins on the chip, but are more likely to be multiplexed with pins which are employed for other uses. Traditionally, the bus for conveying the module's output is coupled to each of the module's outputs. While this method allows for accessing the module directly for testing, it does not provide for verifying the module's connections with other modules. Testing these connections would then typically require additional test hardware, a new test method and would also require that an additional configuration-specific test be written.

SUMMARY OF THE INVENTION

An apparatus is disclosed which provides solutions to some of the above-mentioned limitations and disadvantages associated with conventional configuration-dependent testing of reusable modules within integrated circuits. The present invention provides a test access architecture for testing modules within an integrated circuit, particularly those modules that are re-used in many systems and for which standard test vectors are available. Modules are tested by controlling their inputs at the module boundary and observing their outputs at the boundaries of the modules whose input signals are fed by the output from the target module.

Each module in the system is provided at its input side with the invented test access circuitry to precondition all module inputs and control module operation while the system is in test mode. During normal operation the test access architecture is fully disabled and contributes only a minimal delay to system operation. During module testing input test vectors are applied in parallel via an input bus to the inputs of the module which has been selected to be the module under test. The outputs of the module are observed either at a system output pin or at the inputs of other modules to which these signals feed. Where outputs feed other module's inputs, the input feedback logic of the test access architecture in the modules not under test routes the signal to an output bus transport mechanism. Thus, during module testing all of a module's inter-module connections are tested as well.

Therefore, it is an object of the present invention to provide a test access architecture scheme that allows embedded testing of generic reusable modules with reusable module test vectors while concurrently testing inter-module connections without additional hardware or special test vectors.

It is also an object of the present invention to provide an apparatus for testing connections between modules and primary system inputs, outputs and I/O's.

It is a further object of the present invention to provide an apparatus for internal node controllability and observability within the same framework of the rest of the test access scheme.

It is also an object to provide all of the above with a minimum of silicon overhead and with no functional and minimal performance impact upon normal mode operation of the integrated circuit.

BRIEF DESCRIPTION OF THE DRAWINGS

FIG. 1 is an overview of a general integrated circuit which has modularized circuitry.

FIG. 2 is a schematic of the input side of one module within the integrated circuit of FIG. 1 employing circuitry for providing the module with input test vectors in accordance with a preferred embodiment of the present invention.

FIG. 3 is a schematic of the input side of one module within the integrated circuit of FIG. 1 employing circuitry for rerouting to an output bus the output from a tested module which it has received as input in accordance with a preferred embodiment of the present invention.

FIG. 4 is a schematic of the input side of one module within a modularized integrated circuit embodying the circuitry of both FIGS. 2 and 3 in accordance with a preferred embodiment of the present invention.

FIG. 5 is another embodiment of the present invention being used as an internal node controllability port within a module of an integrated circuit.

FIG. 6 is another embodiment of the present invention being used as an internal node observability port within a module of an integrated circuit.

FIG. 7 is another embodiment of the present invention employing the circuitry of both FIGS. 5 and 6 within a module of an integrated circuit for either controllability or observability.

FIG. 8 is yet another embodiment of the present invention employing the circuitry of both FIGS. 5 and 6 within a module of an integrated circuit for simultaneous controllability and observability.

DETAILED DESCRIPTION OF THE INVENTION

Referring first to FIG. 1, a generic modularized integrated circuit 10 is shown. The generic integrated circuit 10 is a simple chip comprising five separate modules 11, 12, 13, 14 and 15. Integrated circuit 10 is illustrated such that module 13 is designated the module under test (MUT). The MUT 13 is shown with four module inputs 16*a*–16*d* and four module outputs, 17*a*–17*d* which fan out to provide two inputs to module 14, two to module 15 and two to the primary chip outputs. Each of these inputs and outputs may actually comprise a plurality of signal lines, the number depending on the module's design and purpose. As can be seen, some module inputs will come from primary system inputs while others are signals which have propagated through other modules. To comprehensively test the integrated circuit 10, it is essential to test the logic of each module 11–15 as well as each module's inter-module connections and primary outputs. Thus, a thorough test of module 13 must include testing its logic as well as the six connection paths identified above fanning out from the four module outputs 17*a*–17*d*.

Conventional bus-based test architectures include a bus for driving test inputs directly to the module's inputs from system pins. Also provided is a bus which is coupled directly to the module's outputs for driving the module's outputs to primary system outputs for observation. The module's connections to other modules and primary inputs and outputs are thus not tested by the conventional bus-based approach. As will be seen, the present bus approach will actually route the MUT's outputs from the input side of the modules to which the MUT feeds, thereby verifying the module connections as well as the logic of the MUT.

Not shown in FIG. 1 is an additional plurality of signal lines running throughout the chip which provide necessary system signals and the test signals that will be referred to throughout the following description. Methods for conveying control signals and addresses are well known in the art and will not be described further herein except with respect to those signals that are used in testing operations to designate whether a particular module has been selected for testing. Also, a more realistic integrated circuit than the one shown in FIG. 1 would have many more than five modules, for example, modules might include counters, timers, DMA controllers, CPUs, analog-to-digital converters, etc. Further, each of these modules may have multiple outputs to other modules or to primary system output pins. Also, many of these modules will be embedded in the integrated circuit with no primary input for supplying the necessary test vectors to that module. The logic that is necessary for providing control signals will depend on the system for which it is implemented. It should be designed to be compatible with any existing system and test signal treatments.

As noted above, it is desirable to be able to use the same test vectors for identical modules regardless of their configuration in a given implementation. To accomplish this it is necessary that the module be able to receive the test vector set without the signals having to pass through other modules of the system. Accordingly, the integrated circuit is provided with a test input bus (Tin bus). The Tin bus may be multiplexed with normal system input pins such that when the system is in test mode data is passed to the Tin bus through those pins which otherwise are used for normal purposes or the bus may have its own dedicated pins. The Tin bus is a data line that runs throughout the semiconductor to the input sides of all of the modules of the system. The Tin bus can be either a predefined width to which all modules and their tests conform or as wide as the largest number of module inputs for any single module depending upon available silicon resources, pin availability, acceptable test length and speed.

FIG. 2 shows how a module is configured in accordance with the present invention to receive either normal operation mode inputs or test vector inputs when the module is the MUT. FIG. 2 shows a single module 20 within an integrated circuit. The module may be of any type, examples of which are identified above. The module 20 contains module logic 21 which is the standard logic for whatever type of module that module 20 is. The remaining circuitry shown within module 20 is a portion of the circuitry of the present invention for selecting which input signals will be passed to the module logic.

FIG. 2 shows the logic of the present invention that is of importance to a particular module when it is the one designated as the MUT. It is during the configuration stage of testing when one of the integrated circuit's modules is so designated based on a unique test address that each module has. For any given testing configuration only one module will be selected for testing. More will be said concerning the configuration stage of testing in subsequent paragraphs.

Two input paths are shown into module 20 of FIG. 2, the module's system inputs *22a–22x* and the testing system inputs *23a–23x*. The number of actual signals conveyed by inputs 22 and 23 will depend on the type of module that module 20 is. The module's system inputs 22 receive signals from either direct pin inputs of the chip or from the outputs of other modules, depending upon the configuration of the integrated circuit. The test system inputs 23 receive signals from the Tin bus 24. As indicated above, signals are passed to the Tin bus during test mode by multiplexing otherwise normal system input pins onto the Tin bus. Once the system has been configured for testing, the data transmitted along the Tin bus will be the input test vector set for the MUT.

The remaining logic elements of the test access architecture that are used by a module that is selected as the MUT are a multiplexer 26, multiplexer enable logic 27 and the data/configuration latch 25. In test mode, when a module is the MUT, the latch 25 is used to feed the test system C input signal, from the Tin bus, into the module's logic. When the module is not the MUT and the system is in test mode, the latch 25 is used to control enabling of selected feedback drivers associated with that module for routing signals to the Tout bus (shown in FIG. 3).

The data latch 25 for a given module will have the same number of bits as there are required input signals to the module. If that number is narrower or equal to the width of the Tin bus then the latch will be transparent to test vector C inputs and signals will pass directly from the Tin bus through to the multiplexer logic 26. If there are more required input signals than the Tin bus is wide, then some of the bits of the data latch 25 will have to be held to desired values while only selected bits are left drivable by the Tin bus. Each configuration of input bits that are drivable by the Tin bus in a given cycle is called a test set. Bit selection in the data latch 25 is controlled by applying associated set enable signals for the desired bits. Because switching between test sets takes some time, selection of drivable bits should be done in such a way as to minimize set switching. This will depend on the type of module being tested and the inputs it requires. The less test set switching that is necessary, the closer to full speed the testing will be able to proceed.

The multiplexer 26 of FIG. 2 receives as inputs both the data from the module's system inputs 22 as well as the data from the test system inputs 23. The multiplexer enable logic 27 controls the selection of which of these signals will be passed to the module logic. The multiplexer enable logic 27 receives input signals which indicate when the system is in test mode and when the module is the MUT. When the system is in test mode and the module is the MUT then the multiplexer enable logic 27 addresses the multiplexer 26 such that it passes the signals from the data latch 25 to the module logic 21. Thus, when the system is in test mode and module 20 is the MUT, the input test vectors for the particular module logic 21 will be passed from the Tin bus 24 through the module logic 21 and out module outputs 17.

The results of the module logic operating upon the test vector stimulus set are outputted through module outputs 17. If the module is operating according to its design specifications, then the output data will match the expected values. The output, however, is not checked at the output side of module 20 as it would be in a typical direct access bus test scheme. If the output feeds a primary system output then the output may be watched at the system pin to which the output is fed. In this case, the module logic would be verified as well as the connection to the primary system output. However, where the module under test outputs to the input of another module (or modules) another method of verifying the output values is needed. This is shown in FIG. 3.

FIG. 3 shows the other portion of the preferred embodiment circuitry of the present invention applied to the input side of a module 20. This circuitry is used when the system is in test mode, but while the module 20 is not the MUT. Like all the modules of the system, the module 20 has its own module logic 21 as well as the circuitry of the present invention applied to its input side. The circuitry of concern for the module that is not under test is the input feedback logic. The input feedback logic of a module not under test receives input signals from the MUT's outputs and then reroutes those signals out through the module's test system outputs 31 to the Tout bus 30. The Tout bus is similar to the Tin bus, but it need not be of a fixed width like the Tin bus because its width can be chosen to be whatever is appropriate for the particular configuration. (Unlike the Tin bus which may be used for carrying transportable test vectors of a width chosen regardless of a particular configuration.) Like the Tin bus, during test mode, the Tout bus may be multiplexed to some of the system output pins for observation by means of a VLSI tester or similar means.

The input feedback logic in accordance with a preferred embodiment of the present inventions comprises configuration latch 25, feedback tristate controllers 32 and feedback drivers 33. The configuration latch 25 is the same latch as the data latch 25 of FIG. 2 being used for a different purpose. Here, it is used to control which of the output drivers 33 will be enabled for driving signals to the Tout bus. If the number of outputs to drive is fewer than the width of the Tout bus, then all drivers will be activated for routing signals to Tout bus.

When a module is not the MUT and the system is in test mode, the module not under test receives as input whatever signals are passed to it through the module's system inputs 22. The modules not under test of concern here are those that receive as their inputs the outputs from the MUT. If module 20 is not the MUT and during configuration it was designated to feedback all or some of its inputs to the Tout bus, then configuration latch 25 enables the selected feedback drivers 33 which are coupled to the module's input lines and routes the selected signals to the Tout bus.

The feedback tristate controllers 32 may comprise a number of different forms of logic, but essentially it need only be able to act in the case that three signals are asserted: (1) that the system is in test mode; (2) that the module is not the module under test; and (3) that its associated signal was selected during configuration to be routed to the Tout bus for the current testing cycle.

Referring now to FIG. 4, a module 20 employing the complete logic of the preferred embodiment is shown. This circuitry is to be included on all modules within the system at the input side of the modules. Thus, each module is capable of receiving transportable input test vectors from the Tin bus when it is the MUT, and each module, when it is not the module under test, is capable of routing the output of the MUT out to the Tout bus. The signal that is routed to the Tout bus is the output from the MUT after passing through the connection between the MUT and a particular module not under test. Therefore, a valid test output shows that not only is the logic of the module under test properly functioning, but that the module's inter-connects with other modules are functioning.

For each of the modules, it is necessary to check all of their interconnects with the other modules and with the primary system outputs if there are any. Therefore, for a given MUT, the Tout bus may be returning signals routed from a number of modules that are not under test. This is established during the configuration stage of testing. Modules are configured by passing configuration data through the Tin bus to set control bits in the configuration latch 25 of desired modules not under test. During configuration for testing of a given MUT, certain signals from modules not under test will be selected as those that are to be rerouted to the Tout bus. The number of these signals is limited by the width of the Tout bus. If the Tout bus is not wide enough to receive all of the signals from the modules not under test which receive inputs from the MUT, then multiple passes of the full input test vector set will be made. That is, on the first pass, only some of the signals will be selected to be rerouted to the Tout bus. Then, when the test vectors are supplied through the Tin bus to the MUT, the MUT will output to the inputs of the modules it feeds, and those bits that have been selected will feedback to the Tout bus. Then on subsequent passes, remaining signals will be selected as the ones which are to be rerouted to the Tout bus. This will be repeated until testing of all MUT's outputs via all interconnect paths is completed. In this way the logic of the MUT is tested and all of the module's connections with other modules are verified.

To test the connection of the MUT to a primary system output, the output may be checked directly at the system pin by any of those means identified above, thereby verifying the logic of the MUT as well as the connection to the primary system output. For testing the connections from primary system inputs, all modules are designated as not under test. Then in the configuration cycle the module inputs which receive primary system inputs are selected to reroute their inputs to the Tout bus as described above. In this manner, all connections from primary system inputs to those modules they feed may be verified.

The above discussion of the preferred embodiment has omitted any discussion of the system clock or global signals. In the preferred embodiment, the test logic runs independent from the system clock fed to the modules. The system clock signal is essentially a global signal which may be excluded from the test scheme because it can be directly accessed externally.

The test control logic of the present invention may also be controlled by a test clock or may be independent of a clock signal as in the case of a register-based interface. In the preferred embodiment of the present invention, a test clock from a central controller in accordance with a standard set by IEEE 1149.1 is used. Those of ordinary skill in the art will be familiar with IEEE standards and nothing more will be said about them herein. The advantage to using a clock signal independent of the normal system clock is that the system clock may then be controlled as required to extend cycles in the case where test set de-multiplexing has to occur.

In another embodiment of the present invention, the circuitry described above can be modified to provide for internal testing of logic within a module. The present invention provides a way of supplying test mode controls within the module logic as well as observing or driving internodal values within the module logic. In fact, both may be done simultaneously. This will now be described with respect to FIGS. 5–8.

FIG. 5 illustrates a version of module 20 modified to show the test circuitry of another embodiment of the present invention. The portion of the circuitry shown in FIG. 5 allows internal node controllability by enabling a predetermined test signal to be fed to a node within the module logic. The circuitry at the input side of the module is the same as that shown in FIG. 4. Here, however, the module logic 21 is shown divided into two parts, 21*a* and 21*b*. Embedded between the two parts of the module logic is the test circuitry for supplying a test value to a node within the module logic. This test circuitry comprises latches 35 and 36, multiplexer 37 and multiplexer enable logic 38. This circuitry is embedded within the module logic at the node where it is desired to drive a predetermined value. This could be used for many purposes. For example, if the module is a 32-bit counter, and it is desired to observe some result in the system when the counter is at a very high value, it is not necessary to cycle through many clock cycles; the desired value may simply be inserted at the desired node.

To supply a test value to an internal node of the module 20, the test circuit of FIG. 5 is employed in the following manner. The Tin bus supplies the configuration data through test inputs 23*a*–23*c*. The module and the system are configured such that the module is selected to be the MUT, and the circuitry at the input side of the module will pass the module test inputs through the Tin bus inputs 23*a* through to the module logic. During configuration, Tin bus 24 also supplies through module test inputs 23*b* to the test mode control latch 35 the required control bit for selecting the source of the input to the node between the first and second parts of the module logic 21*a* and 21*b*. Data latch 36 receives through module test inputs 23*c* from the Tin bus 24 the data value to be driven at the internal node of the module logic. The multiplexer 37 passes to the second part of the module logic either the control data from the data latch 36 or the signal from the first part of the module logic. The multiplexer is controlled by the multiplexer enable logic 38 which performs a gate function based upon the system's test signals and the control bits within control latch 35. Thus, when not exercising control of the node, the test circuitry is transparent to the module logic and the logic operates as a whole on the supplied system input signals. When exercising control of the node, a desired test value from test inputs 23*c* is passed through the second part of the module logic and the module logic outputs the result through usual module outputs 17. The modules not under test which are fed by the tested module can also be configured to reroute the output of the MUT to the Tout bus.

Referring now to FIG. 6, the portion of the alternative embodiment of the present invention for observing a value at an internal node within the module logic is shown. As in FIG. 5, the module logic 21 is shown in two parts, 21*a* and 21*b*. The circuitry at the input side of the module is substantially the same as that disclosed and discussed with respect to FIG. 4. In this portion of the alternative embodiment, test observation circuitry is coupled to a node within the module logic 21. This circuitry is also coupled to the Tout bus through module test outputs 31*b*. The portion 40 of the circuitry of the alternative embodiment resembles the Tout bus driving circuitry Of FIG. 3. The control latch 39 receives control bits from the Tin bus 24 through the module test inputs 23*b* during the configuration cycle. By setting selected bits of the control latch 39, associated signals at the internal node will be enabled to be conveyed to the Tout bus 30. The manner of driving selected signals to the Tout bus is similar to that described with respect to the feedback driving of FIG. 3.

FIG. 7 shows module 20 equipped with circuitry to either observe selected signals at a node within the module logic or to control the signals passed through the same node within the module logic. In FIG. 7, the circuit shown between the two parts of the module logic 21*a* with module output 47*a* and 21*b* with module output 47*b* is essentially the same as that shown in FIGS. 5 and 6. Note that here, the latch 36 of FIG. 5 is the same component as the latch 39 of FIG. 6. When the module is configured for node observability, the latch is used to enable selected feedback drivers 33,40 for driving desired signals to the Tout bus. When the module is configured for node controllability, the latch serves as a data register for driving signals from the Tin bus to the internal node. The operation of the circuit of FIG. 7 is essentially the same as that described with respect to FIGS. 5 and 6 with the operation being determined by the setting of the control bits in the latches during the configuration and data cycles.

FIG. 8 shows another configuration of the alternative embodiment of the present invention. Similar to FIG. 7, the circuitry of FIG. 8 is for both observing or controlling the signal at the same internal node within the module logic 21. Here, both functions may be carried out simultaneously. The difference from FIG. 7 is that in FIG. 8, separate latches 36 and 39 are required for storing the data value to be driven and controlling the feedback driving circuit respectively.

The logic at the chip level required to control the individual test logic associated with each module can be built in a variety of ways depending on the application and its requirements. In all cases there will be a need for a Test Input Bus to provide a parallel data path to control the inputs of the module under test, a parallel Test Output Bus to provide a means of observing the selected embedded system inputs of the modules not under test, and some means of controlling the module test logic for all modules.

These buses and control signals could be dedicated to test purposes, but typical constraints such as device pin-counts are likely to dictate some kind of multiplexing with system functions. Since this might make these system functions untestable by this scheme, some special measures should be taken to ensure they remain testable. A good generic approach is to multiplex each test function with more than one system function and provide selection of which is used during the configuration stage before the test is initiated. Alternatives might be to simply find another method of testing such system functions, or find system functions—such as pure inputs that can still be tested even when overlapped with test inputs. Many alternatives and trade-offs exist and it is only important to consider how each will affect the overall testability of the device and what compromises are acceptable.

Most control information can be passed to the modules via the Test Input Bus, especially if the input bus is as wide as the largest number of inputs on any module. However, if the input bus is used to control the modules and demultiplexing off the input bus is also required at the module test logic then there will be a cycle time overhead in switching to the next input set since both control and data usually cannot be transferred on the same bus in the same cycle.

The generalized test control logic may be implemented as a centralized function or may be fully or partially distributed to the modules themselves. This will be based on system considerations and should not affect the realization of this test scheme in any major way.

In the preferred embodiment implementation, a partially distributed module control scheme is used with a small central controller based on the IEEE 1149.1 standard TAP controller. This provides a means of getting some test control that is dedicated with no interference with other normal system functions. The modules contain module address decoding, "module under test" latching, set decoding and enabling and special test mode control decoding (e.g., internal node controllability and observability ports). The test input bus may also be used for passing test control information during configuration. These considerations along with some configuration rules for the modules allow for the full testing of embedded modules.

Whereas many alternatives and modifications of the present invention will no doubt become apparent to a person of ordinary skill in the art after having read the foregoing description, it is to be understood that the particular embodiments shown and described by way of illustration are in no way to be considered limiting. Reference to the details of the preferred embodiment are not intended to limit the scope of the claims which themselves recite only those features regarded as essential to the invention.

What is claimed is:

1. In an integrated circuit implemented on a chip and having a plurality of chip inputs for routing signals onto said chip and a plurality of chip outputs for routing signals out of said chip and at least first and second circuit modules, said first circuit module comprising module logic circuitry including first and second circuits coupled at an intermediate node, test circuitry for introducing a predetermined signal value at said intermediate node of said first circuit module, the test circuitry comprising:

means for directly propagating said predetermined signal value to said intermediate node of said first circuit module, said first circuit module operating on said predetermined signal value to generate a result signal;

means for conveying said result signal, generated by said first circuit module, from an output of said first circuit module to an input of said second circuit module; and means for conveying said result signal, generated by said first circuit module, from the input of said second circuit module to a subset of said plurality of chip outputs.

2. The test circuitry of claim 1 wherein said means for directly propagating said predetermined signal value comprises a test input bus selectively coupled to a subset of said plurality of chip inputs and to said first circuit module.

3. The test circuitry of claim 2 wherein said means for conveying said result signal, generated by said first circuit module, from said output of said first circuit module to said input of said second circuit module comprises a module interconnect coupling said output of said first circuit module and said input of said second circuit module.

4. The test circuitry of claim 3 wherein said means for conveying said result signal, generated by said first circuit module, from said input of said second circuit module comprises a test output bus, coupled to said subset of said plurality of chip outputs and to said input of said second circuit module, for propagating said result signal, generated by said first circuit module, from said input of said second circuit module out of said integrated circuit.

5. The test circuitry of claim 4 further comprising signal feedback circuitry for routing said result signal, generated by said first circuit module, from said input of said second circuit module onto said test output bus.

6. In an integrated circuit implemented on a chip and having a plurality of chip inputs for routing signals onto said chip and a plurality of chip outputs for routing signals out of said chip and at least a first circuit module comprising module logic circuitry including first and second circuits coupled at an intermediate node, test circuitry for observing a signal value at said intermediate node, the test circuitry comprising:

a test input bus selectively coupled to a subset of said chip inputs and to said first circuit module for conveying instructions to said first circuit module;

a test output bus selectively coupled to a subset of said chip outputs and to said first circuit module for conveying signals from said first circuit module to said subset of chip outputs; and driving circuitry responsive to instructions from said test input bus for routing signal values from said intermediate node to said test output bus for observation at said chip outputs.

7. An apparatus for testing a first circuit module within an integrated circuit on a chip wherein said first circuit module has first circuit module logic having an intermediate node, said integrated circuit having at least a second circuit module coupled to said first circuit module by a module interconnect, said second circuit module having second circuit module logic, said apparatus comprising:

a test input bus coupled to said first circuit module for conveying a test input signal to said intermediate node of said first circuit module logic;

a test output bus coupled to said second circuit module for conveying a test result signal, generated by said first circuit module, out of said integrated circuit;

first signal routing circuitry incorporated in said first circuit module and coupled to said test input bus for receiving said test input signal and for propagating said test input signal to said first circuit module logic at said intermediate node; and second signal routing circuitry incorporated within said second circuit module and coupled to said module interconnect for receiving said test result signal, generated by said first circuit module, from said first circuit module and routing said test result signal, generated by said first circuit module, to said test output bus from said second circuit module, bypassing said second circuit module logic.

8. In an integrated circuit implemented on a chip and having a plurality of chip inputs for routing signals onto said chip, a plurality of chip outputs for routing signals out of said chip and first and second circuit modules wherein said first circuit module has module logic circuitry including first and second circuits coupled at an intermediate node, a method of testing said first circuit module comprising the steps of:

propagating a test input signal over a test input bus on said chip that is coupled to a subset of said chip inputs and to said first circuit module, incorporated on said chip, at said intermediate node;

selecting said test input signal as an input signal to the first circuit module at said intermediate node;

propagating a test result signal, generated by said first circuit module, from said first circuit module over a module interconnect to said second circuit module incorporated on said chip; and routing the test result signal, generated by said first circuit module, from said second circuit module onto a test output bus incorporated on said chip and out of said integrated circuit, said test output bus being coupled to a subset of said chip outputs.

* * * * *

UNITED STATES PATENT AND TRADEMARK OFFICE

CERTIFICATE OF CORRECTION

PATENT NO. : 5,604,432

DATED : February 18, 1997

INVENTOR(S) : Moore, et. AL.

It is certified that error appears in the above-indentified patent and that said Letters Patent is hereby corrected as shown below:

In the Title Page at [54] delete "CIRCUITS" and insert --CIRCUIT-- and col. line 2.

In column 5 at line 31 delete "C"

In column 5 at line 41 delete "C"

Signed and Sealed this

Twenty-ninth Day of July, 1997

Attest:

BRUCE LEHMAN

Attesting Officer

*Commissioner of Patents and Trademarks*